United States Patent [19]

Fiordalice et al.

[11] Patent Number: 5,534,462
[45] Date of Patent: Jul. 9, 1996

[54] METHOD FOR FORMING A PLUG AND SEMICONDUCTOR DEVICE HAVING THE SAME

[75] Inventors: Robert W. Fiordalice; Papu D. Maniar; Jeffrey L. Klein; Bernard J. Roman, all of Austin, Tex.

[73] Assignee: Motorola, Inc., Schaumburg, Ill.

[21] Appl. No.: 393,782

[22] Filed: Feb. 24, 1995

[51] Int. Cl.$^6$ .................................................. H01L 21/44
[52] U.S. Cl. .......................... 437/190; 437/192; 437/194; 437/195; 437/203
[58] Field of Search ...................................... 437/190, 192, 437/203, 194, 195, 225, 228, 245; 216/52, 18; 156/652.1

[56] References Cited

U.S. PATENT DOCUMENTS

| | | | |
|---|---|---|---|
| 4,184,909 | 1/1980 | Chang et al. | 156/643 |
| 4,798,648 | 12/1988 | Chow et al. | 437/225 |
| 4,832,789 | 5/1989 | Cochran et al. | 437/228 |
| 4,884,123 | 11/1989 | Dixit et al. | 357/71 |
| 4,936,950 | 6/1990 | Doan et al. | 156/643 |
| 4,981,550 | 1/1991 | Huttermann et al. | 437/194 |
| 4,997,789 | 3/1991 | Keller et al. | 437/194 |
| 5,225,372 | 7/1993 | Savkar et al. | 437/192 |
| 5,272,117 | 12/1993 | Roth et al. | 216/52 |
| 5,328,553 | 7/1994 | Poon | 437/228 |
| 5,332,467 | 7/1994 | Sune et al. | 156/636.1 |
| 5,374,591 | 12/1994 | Hasegawa et al. | 437/192 |
| 5,399,235 | 3/1995 | Mutsaers et al. | 437/194 |

FOREIGN PATENT DOCUMENTS 0055932  3/1988  Japan ..................................... 437/192

OTHER PUBLICATIONS

J. Givens, et al.; "Selective dry etching in a high density plasma for 0.5 μm complementary metal-oxide-semiconductor tech.;" J. Vac. Sci. Technol. B, vol. 12, No. 1, pp. 427–432 (Jan./Feb. 1994).

C. Yu, et al.; "Deposition, Characterization, and Application of Aluminum Nitride Thin Films for Microelectronics;" Mat. Res. Soc. Symp. Proc., vol. 264, pp. 401–405 (1992).

S. Bhat, et al.; "Reactive Ion Beam Deposition of Aluminum Nitride Thin Films;" Journal of Elect. Materials, vol. 14, No. 4, pp. 405–418 (1985).

R. K. Sadhir, et al.; "Preparation of Aluminum Nitride Thin Films for Use in Microelectronics;" IEEE; Ch. 2452–1, pp. 17–21 (1987).

R. G. Gordon, et al.; "Chemical vapor deposition of aluminum nitirde thin films;" J. Mater. Res., vol. 7, No. 7, pp. 1679–1684 (1992).

S. J. Pearton, et al.; "Dry and wet etching characteristics of InN, AlN, and GaN deposited by electron cyclotron . . . ;" J. Vac. Sci. Technol. A, vol. 11, No. 4, pp. 1772–1775 (1993).

P. B. Legrand, et al.; "Optical properties of sputter–deposited aluminum nitride films on silicon;" SSDI, pp. 220–223 (1994).

Primary Examiner—Tuan H. Nguyen
Attorney, Agent, or Firm—Patricia S. Goddard

[57] ABSTRACT

A conductive plug (46) is formed in a semiconductor device (30) by using an aluminum nitride glue layer (42). The glue layer is deposited on an interlayer dielectric (40) prior to forming a contact opening (44), such that the glue layer does not line the opening sidewalls or bottom. Tungsten or other plug material is then deposited in the opening and on the glue layer and subsequently polished or etched back to form the plug. The remaining portions of the glue layer may be left within the device or removed as deemed appropriate.

25 Claims, 4 Drawing Sheets

METHOD FOR FORMING A PLUG AND SEMICONDUCTOR DEVICE HAVING THE SAME

CROSS-REFERENCE TO RELATED APPLICATIONS

Material related to the subject matter of the present invention is disclosed in the following co-pending, commonly assigned patent applications:

1) Ser. No. 08/393,783, filed Feb. 24, 1995, by Maniar et al., entitled, "Method for Providing Trench Isolation and Semiconductor Device Having the Same;" and 2) Ser. No. 08/393,781, filed Feb. 24, 1995, by Maniar et al., entitled, "Semiconductor Device Having Anti-Reflective Coating and Method for Making the Same."

FIELD OF THE INVENTION

The present invention relates to semiconductor devices in general and more specifically to methods for forming conductive plugs in semiconductor devices.

BACKGROUND OF THE INVENTION

Tungsten plugs are becoming a widely used form of making electrical connections between various conductive layers in semiconductor devices such as integrated circuits. Generally, tungsten plugs are formed by first depositing an interlayer dielectric over a first conductive layer of a semiconductor device. Openings are then etched in the interlayer dielectric to expose portions of the first conductive layer. Next, a tungsten layer is blanketly deposited over the device, thereby filling the openings in the interlayer dielectric and making contact to the first conductive layer. The tungsten is then either polished or etched back to remove all portions of the tungsten layer but for the portions lying within the opening of the interlayer dielectric. The result is a tungsten plug which serves as a vertical electrical contact to the first conductive layer.

One problem with the basic process described above is that tungsten does not readily adhere to commonly used interlayer dielectric materials such as silicon dioxide, in the form of phospho-silicate-glass (PSG), boron-doped PSG (BPSG), thermal-oxide, or plasma-enhanced oxide, and silicon nitride. Accordingly, use of tungsten plugs has generally required the use of a glue layer to ensure the tungsten adheres to the device. A typical use of a glue layer is demonstrated in FIGS. 1–2, which are illustrations representing a cross-section of a portion of a prior art semiconductor device 10. As shown in FIG. 1, semiconductor device 10 includes a semiconductor substrate 12 over which is formed a first dielectric layer 14 and a metal interconnect 16. An interlayer dielectric 18 is deposited, patterned, and etched to create a contact opening or plug opening 19 which exposes the interconnect. A glue layer 20 is then deposited on top of the interlayer dielectric and along the sidewalls and the bottom of opening 19. Glue layer 20 may be a single material, for instance titanium nitride, but is often a combination of sequentially deposited titanium and titanium nitride layers, depending upon to what conductive material contact is being made. Next, a tungsten layer 22 is blanketly deposited on the glue layer of device 10 to fill opening 19, as shown in FIG. 1. To provide electrical isolation between a plurality of filled openings with the device, the tungsten layer and portions of glue layer 20 lying beyond each opening 19 are removed, as indicated by FIG. 2. Removal of both glue layer 2 and tungsten layer 22 is generally accomplished either by etching or by polishing. The result is a tungsten plug 24 formed in opening 19, and having a surrounding glue layer 20 separating the tungsten plug from interlayer dielectric 18.

Use of a titanium and titanium nitride glue layer in forming tungsten plugs as discussed above has several drawbacks. One problem is that throughput is rather slow. The initial titanium layer for glue layer 20 is generally deposited to a thickness of 400 angstroms (Å) or 40 nanometers (nm) using a collimated sputtering deposition process. Collimated sputtering is preferred to ensure that the titanium gets deposited uniformly and to a sufficient thickness along both the sidewall and the bottom of the contact opening. Titanium nitride is likewise sputter deposited, generally to a thickness of 800Å (80 nm). Sputter deposition, and particularly collimated sputtering, is a relatively slow process. For instance, the deposition time required to deposit the aforementioned glue layer thicknesses is approximately anywhere from 3 to 5 minutes per wafer using a 1.5:1 collimator and sequential in situ deposition of the titanium and titanium nitride layers. In addition to valuable manufacturing time spent on depositing the glue layers, removal of the glue layer beyond the contact opening is also quite slow. For example, over one-half the polishing time needed to remove both a tungsten layer 22 and a titanium and titanium nitride glue layer 20 is spent on removing the glue layer, even though the glue layer is about one-fifth (20%) the thickness of the tungsten layer.

Yet another problem of using a glue layer of titanium and titanium nitride relates to contact resistance. The titanium portion of the glue layer is generally used to improve the contact resistance between the tungsten plug and the metal interconnect, as opposed to using titanium nitride by itself as the glue layer. However, even with the addition of titanium as part of the glue layer, contact resistance can still be a problem if the metal interconnect is damaged or contaminated during formation of the contact opening in the interlayer dielectric. For instance, in forming the contact opening using fluorine-based etch chemistries, fluorine will react with the aluminum of the interconnect to form an aluminum oxyfluoride ($AlO_xF_y$) which degrades contact resistance.

DETAILED DESCRIPTION OF A PREFERRED EMBODIMENT

Figure 1:
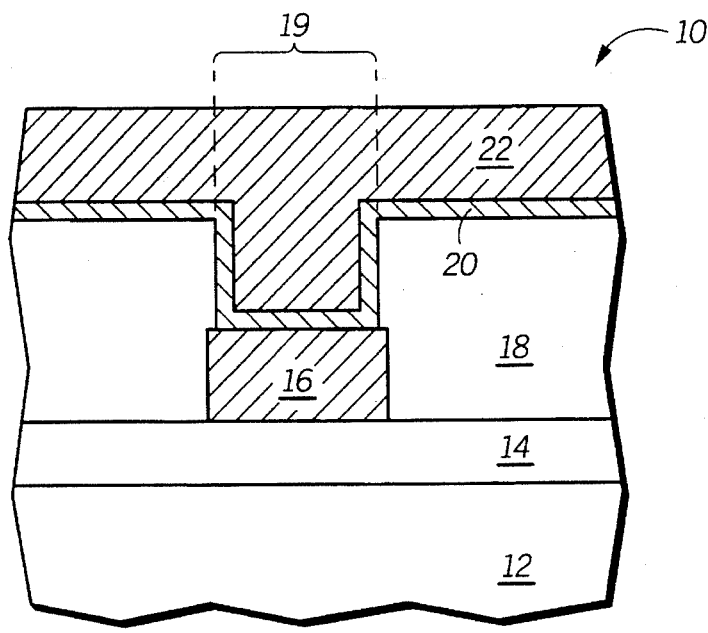
FIGS. 1–2 are cross-sectional illustrations demonstrating a process for forming a conductive plug using a glue layer in accordance with the prior art.
Figure 2:
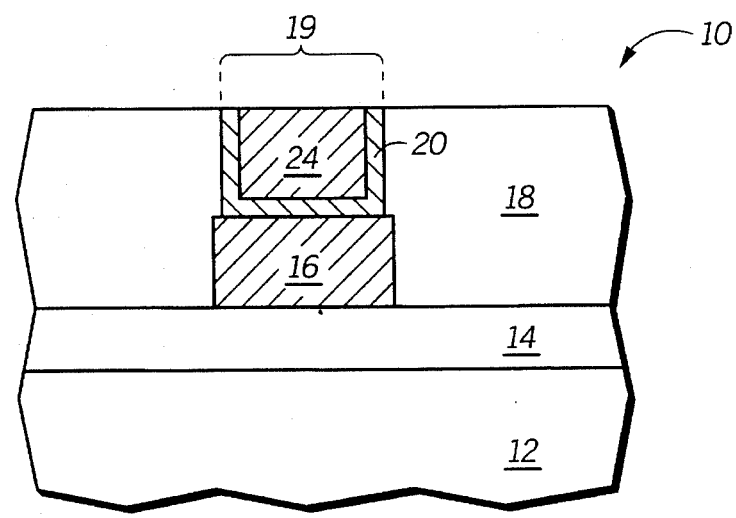

Generally, the present invention provides a method for forming conductive plugs in a semiconductor device without the use of common titanium and titanium nitride glue layers which line the plug opening. Accordingly, manufacturing time involved in depositing and removing these layers is saved in practicing the present invention. The present invention achieves this and other advantages by utilizing a glue layer of aluminum nitride. However, unlike prior art glue layers, the aluminum nitride glue layer need not be removed after deposition, and furthermore does not line the sidewalls and bottom of a plug opening. In accordance with one embodiment of the invention, an aluminum nitride layer is deposited on top of an interlayer dielectric layer. A contact or plug opening is then formed through both the glue layer and the interlayer dielectric to expose a portion of an underlying metal interconnect. Tungsten or other conductive material is then deposited onto the device and into the opening, making electrical contact to the interconnect. The aluminum nitride glue layer improves the adhesion of tungsten to the interlayer dielectric, such that subsequent polishing steps can be performed without peeling or lifting of the tungsten layer from the interlayer dielectric. Despite the fact that the glue layer does not exist in the plug or contact opening, the tungsten plug has adequate adhesion to the interlayer dielectric along sidewalls within the opening. Further, because aluminum nitride is a dielectric material, the glue layer need not be removed after plug formation, so that processing steps in manufacturing time can be reduced as compared to prior art processes.

These and other features and advantages will be more clearly understood from the following detailed description taken in conjunction with the accompanying drawings. It is important to point out that the illustrations may not necessarily be drawn to scale, and that there may be other embodiments of the invention which are not specifically illustrated. Further, it is noted that like reference numerals are sometimes used throughout the various views to denote identical or similar elements.

Figure 3:
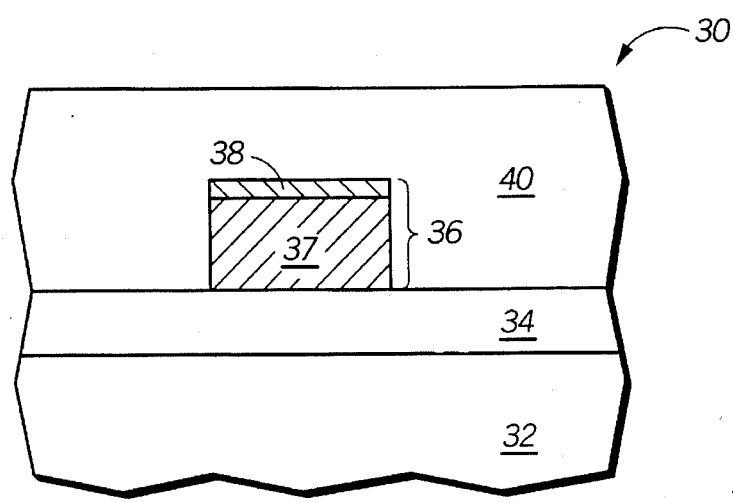
FIGS. 3–8 illustrate in cross-section a process for forming a conductive plug using a glue layer in accordance with the present invention.

FIGS. 3–8 illustrate in cross-section a portion of a semiconductor device 30 as it undergoes processing steps in accordance with the present invention to form a conductive plug. As shown in FIG. 3, an initial structure includes a semiconductor substrate 32 having an overlying dielectric layer 34 and a metal interconnect 36. In semiconductor devices such as integrated circuits, substrate 32 will generally be a single crystal silicon wafer, but can instead be a silicon on insulator (SOD substrate, a silicon on sapphire (SOS) substrate, a gallium arsenide substrate, or the like. Dielectric layer 34 may be a thermally grown silicon dioxide, doped or undoped deposited silicon dioxide, silicon nitride, oxynitride, or other conventional dielectric material used in semiconductor devices.

In a preferred embodiment, metal interconnect 36 includes at least two components, a primary portion 37 and a capping portion 38. The purpose of including capping portion 38 is discussed in more detail in reference to forming a contact opening or plug opening in an interlayer dielectric 40 which overlies the interconnect. In one form, the primary portion of interconnect 36 is aluminum, or more precisely aluminum alloyed with small amounts of copper and/or silicon. Capping portion 38 when used in conjunction with an aluminum primary portion is preferably formed of tungsten. In forming the stacked structure of metal interconnect 36 illustrated in FIG. 3, blanket layers of aluminum and tungsten are simultaneously patterned and etched. Primary portion 37 is formed to have a thickness of 4,000 to 10,000Å (400 to 1,000 nm), and capping portion 38 has a thickness ranging from 500 to 2000Å (50–200 nm). In another embodiment, a titanium nitride barrier layer is formed as part of capping portion 38, such that the capping portion comprises a titanium nitride layer with an overlying tungsten layer. In this alternative embodiment, a titanium nitride layer is sputtered to a thickness of between 250 to 1000Å (25 to 100 nm) prior to depositing the tungsten layer. The tungsten, titanium nitride, and aluminum layers are then all patterned and etched together to form the stacked interconnect. In yet another embodiment, the interconnect has a titanium nitride capping portion having a thickness of 150 to 1000Å (15–100 nm), without an overlying tungsten layer.

Metal interconnect 36 is shown in FIGS. 3–8 as being formed on dielectric layer 34; however, one will appreciate that there may be numerous intervening layers between the interconnect and underlying substrate 32. For example, doped regions, silicide regions, polysilicon layers, isolation regions and various dielectric layers or spacers used to form active device, such as transistors, are likely to be present. For the purposes of understanding this invention however, an understanding of these intervening layers is not necessary and thus will not be discussed or illustrated. Furthermore, dielectric layer 34 is not even required in that a conductive plug in accordance with the present invention can be made to electrically contact a doped or conductive portion of substrate 32 instead of to a metal interconnect.

Continuing with the initial device structure illustrated in FIG. 3, an interlayer dielectric 40 overlies interconnect 36. Interlayer dielectric 40 will generally be a silicon-based dielectric, such as BPSG, PSG, tetra-ethyl-ortho-silicate (TEOS), spin-on-glass (SOG), or plasma-enhanced oxide.

In order to make electrical contact to interconnect 36, an opening must be formed in interlayer dielectric 40 to expose the underlying interconnect. As mentioned earlier, in making this opening there is a potential to damage or contaminate the interconnect, resulting in poor contact resistance. One possible problem is that an aluminum oxyfluoride ($AlO_xF_y$) if fluorine from the etch used to etch the interlayer dielectric comes in contact with the aluminum of the interconnect. In accordance with an embodiment of the present invention, $AlO_xF_y$ formation is avoided by use of capping portion 38. By imposing a tungsten cap on the interconnect, an etch through interlayer dielectric 40 using a fluorine chemistry will prevent exposing the aluminum because the tungsten acts as an etch stop. Furthermore, there is no worry about forming undesirable tungsten oxyfluorides during the etch of the interlayer dielectric because tungsten oxyfluorides are volatile under typical dry etching conditions. To further avoid possible migration of fluorine through a tungsten capping layer, a barrier layer of titanium nitride or other barrier material may be included as part of capping portion 38, as previously discussed. However, tungsten alone may be sufficient by itself to protect the interconnect. Materials other than tungsten can be used for the capping portion, yet still provide the necessary protection of the interconnect during etching. For example, titanium nitride cap alone can be used, and would have the additional benefit of acting as an anti-reflective coating during photolithography operations used to pattern the interconnect metal. It is noted that capping layers are not a necessary part of the invention, but are used as an enhancement to device performance. It is anticipated that in some interconnect structures adequate contact resistance can be achieved without the use of any such capping layers.

Figure 4:
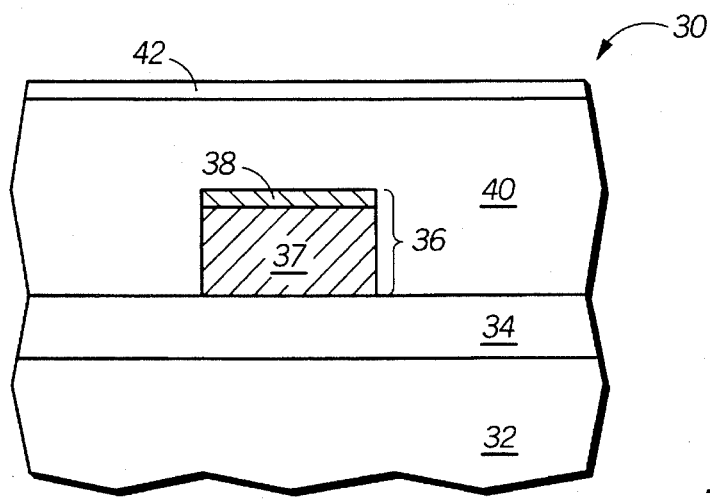

After forming the desired interconnect structure and depositing interlayer dielectric 40, a glue layer 42 is deposited on device 30, as illustrated in FIG. 4. In accordance with the present invention, glue layer 42 is an aluminum nitride layer. In a preferred form, glue layer 42 is deposited using reactive sputtering (RS) with an aluminum target in a nitrogen environment, either pure or in the presence of inert gases such as helium, argon, or the like. Specific process parameters are likely to vary by reactor type and other variables, but can generally be defined as using a substrate temperature of 20° to 500° C., a nitrogen partial pressure of 1.0 to 8.0 mTorr, and a cathode power of 0.5 to 8.0 kWatt. More specifically, an RS process employing 4.0 mTorr nitrogen partial pressure, 300° C. substrate temperature, and 3.0 kW cathode power is preferred. A sputter process using a composite aluminum nitride target is also suited for producing glue layer 42, in which case reactive mode sputtering need not be employed. Other methods of depositing aluminum nitride are also suitable for forming the glue layer, for instance chemical vapor deposition (CVD). Preferably glue layer 42 is deposited to a thickness of 100 to 400Å (10 to 40 nm), preferably 250Å (25 nm). Glue layer 42 can be deposited much thinner than prior art glue layers since there are no step coverage concerns in depositing the glue layer on a relatively planar interlayer dielectric 40 and since deposition is prior to forming contact openings in the interlayer dielectric.

Figure 5:
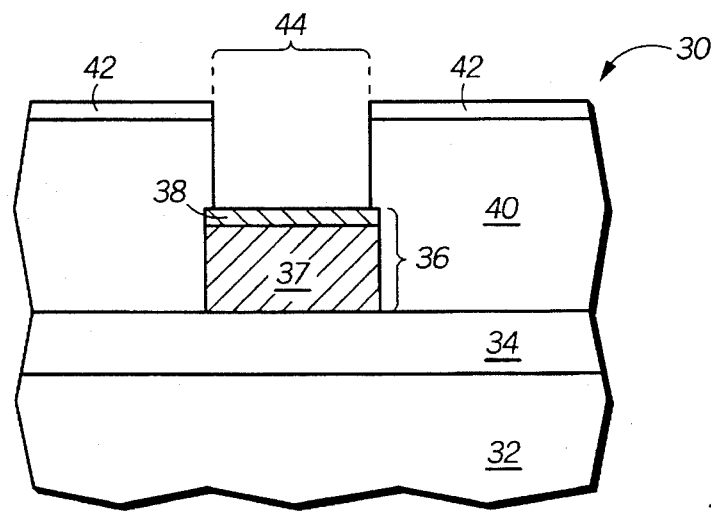

After depositing glue layer 42, device 30 is patterned and etched to form a contact opening or plug opening 44 through glue layer 42 and into interlayer dielectric 40 sufficient to expose a portion of interconnect 36, as shown in FIG. 5. To form opening 44, conventional photolithographic techniques are used to form a resist mask (not shown) which defines where the opening is to be formed. The device then undergoes a dry etch to remove the dielectric materials over the interconnect. A single fluorine-based dry etch chemistry can be used to remove both the aluminum nitride glue layer 42 and interlayer dielectric 40, in-situ. Although aluminum nitride has low etch rates in fluorine, because the glue layer is so thin, it is more efficient to use one etch chemistry to remove both the glue layer and the interlayer dielectric than to employ two different etch chemistries. Removal of the aluminum nitride in a fluorine chemistry particularly possible at the beginning stages of the etch, as selectivity at the beginning of most etches is low. The etch removes portions of the glue layer and the oxide, creating opening 44 which exposes capping portion 38 of the interconnect. As explained above, capping portion 38 protects primary portion 37 of the interconnect during this later stage of the etch by preventing directly exposing aluminum to fluorine. With fluorine-based chemistries there is a high degree of selectivity between silicon dioxide and tungsten, thus opening 44 can be formed by adequately assuring that all dielectric material has been removed from within the opening to provide the best contacting surface. As FIG. 5 illustrates, upon forming opening 44 glue layer 42 is present only in regions beyond the opening, and not along the opening sidewalls or bottom surface as in many prior art structures.

Figure 6:
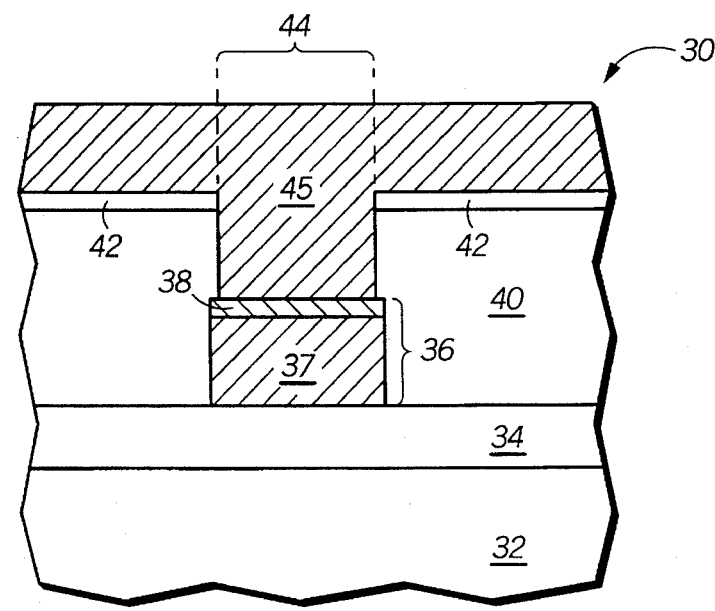

Next, a layer of tungsten, or other suitable conductive plug material, is deposited on device 30. This is shown in FIG. 6 as a conductive layer 45. The plug material is deposited to a thickness sufficient to fill opening 44, which in many cases will be between 2500 to 6000Å (250 to 600 nm). Any known methods for depositing tungsten, or another appropriate conductive plug material, may be used in practicing the present invention. As FIG. 6 illustrates, upon depositing conductive layer 45, the conductive material used to form the plug is only in direct contact with interlayer dielectric 40 within opening 44. Beyond opening 44, conductive layer 45 is separated from the interlayer dielectric 40 by glue layer 42. Thus, on the top surface of interlayer dielectric 40, poor adhesion between tungsten and silicon-based dielectrics is overcome by the presence of the aluminum nitride glue layer 42. During subsequent processing steps, such as polishing, the conductive layer 45 remains intact on the device without peeling or lifting from the device. Notice again that within opening 44, the glue layer 42 does not exist between the conductive layer 45 and the sidewalls of the opening. Despite lack of the glue layer, the adhesion between a tungsten layer and a TEOS interlayer dielectric has been proven to be satisfactory, perhaps due to compressive stresses imposed by processing in and around the opening.

Figure 7:
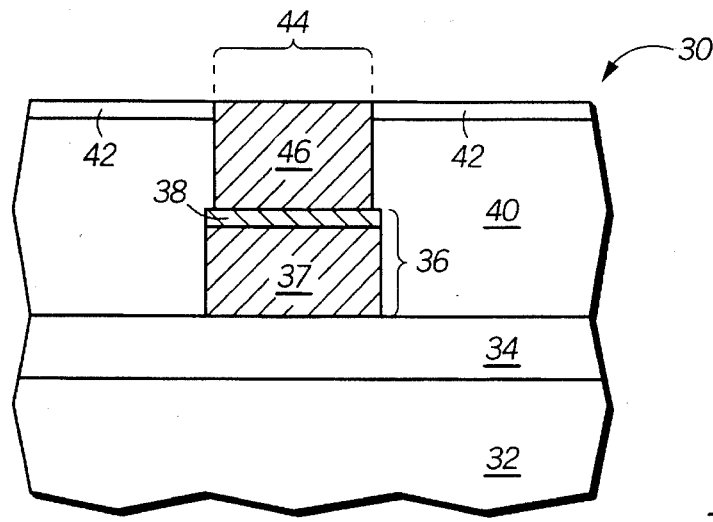
Figure 8:
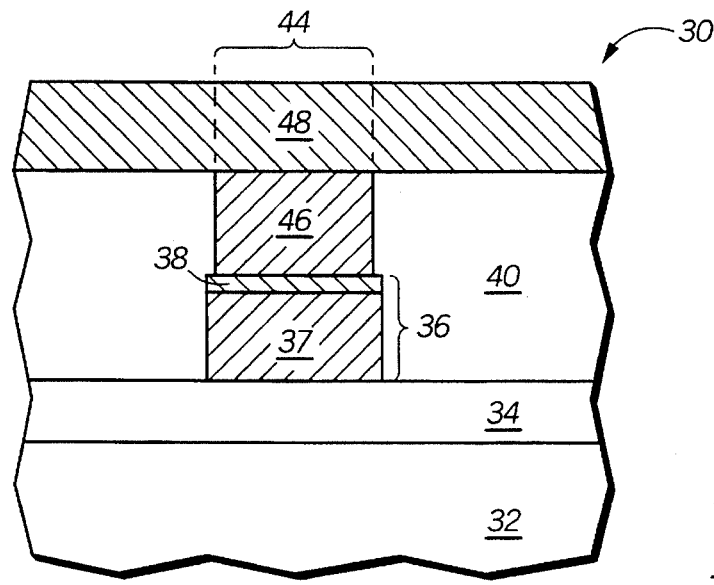

Because deposition of conductive layer 45 will generally be nonselective, there is a need to remove portions of the conductive layer beyond opening 44 to provide electrical isolation of each conductive plug formed. As shown in FIG. 7, conductive layer 45 is either etched or polished back to expose glue layer 42, and leaving a conductive plug 46 formed within opening 44. Preferably the conductive layer is polished back. During the polish or etch back process, remaining portions of glue layer 42 may or may not serve as a stopping layer, depending on the chemistries involved. For example in a chemical mechanical polishing step, tungsten can be removed using a ferric nitrate or hydrogen peroxide slurry with alumina abrasives. This slurry chemistry will also remove the aluminum nitride layer. After polishing, a conductive layer 48 is then deposited over device 30 to make contact to the conductive plug, as illustrated in FIG. 8. In some instances, the aluminum nitride may have a faster polishing rate than the tungsten, in which case a portion of the resulting conductive plug 46 can be raised relative to the adjacent interlayer dielectric 40. A raised plug is advantageous in that it provides a larger contact area for conductive layer 48.

Figure 9:
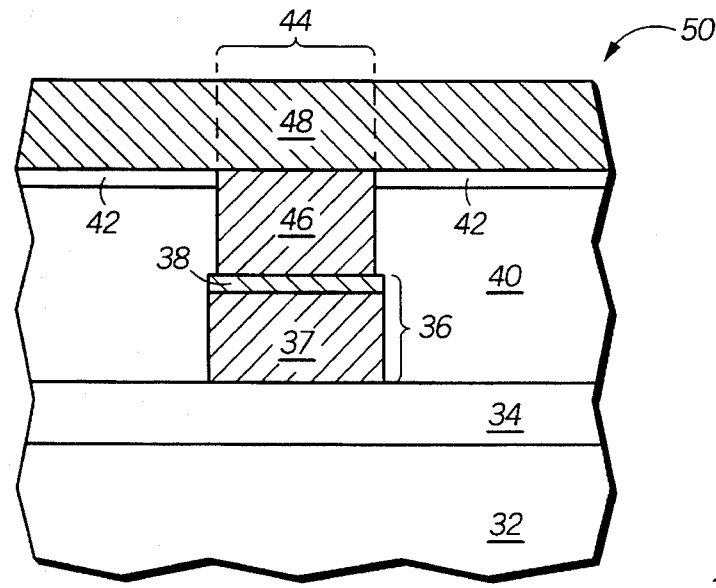
FIG. 9 is a cross-sectional view of a semiconductor device analogous to the view shown in FIG. 8, but in accordance with another embodiment of the present invention.

In an etch back process, a fluorine-based chemistry can be used to etch back tungsten, stopping on the aluminum nitride glue layer. Preferably the aluminum nitride glue layer is removed, although removal is not necessary as discussed later. The aluminum nitride layer can be removed selectively to the underlying interlayer dielectric using a chlorine-based dry, chemical etch. One advantage in removing glue layer 42 by a subsequent chlorine-based etch is that surrounding interlayer dielectric 40 is recessed from the top surface of the conductive plug 46 approximately by the thickness of the removed glue layer. As discussed above, having the dielectric recessed from the plug facilitates the ability to contact the conductive plug by a subsequently deposited conductive layer and increases the contact area. Alternatively, glue layer 42 may be left in the device prior to depositing a subsequent conductive material in contact with the conductive plug. As shown in FIG. 9, the remaining portions of glue layer 42 beyond opening 44 remain in a semiconductor device 50. Because the glue layer is formed of aluminum nitride, which is a dielectric, there is no concern over electrically short circuiting the conductive plug to other conductive plugs or conductive members, as would be the case in using many conventional glue layer materials. Moreover, aluminum nitride is compatible with both front-end and back-end processing conditions such that removal is unnecessary.

Figure 10:
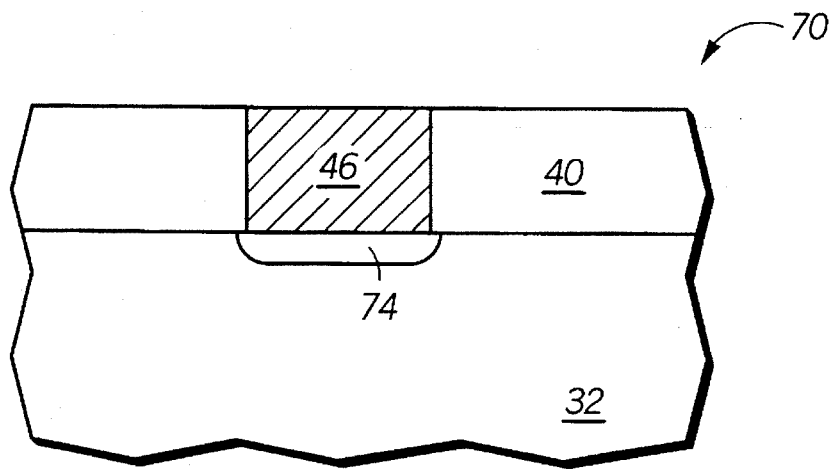
FIG. 10 is a cross-sectional view of a semiconductor device also in accordance with the present invention wherein a conductive plug is formed to a conductive region in the form of a doped substrate region.

FIG. 10 illustrates, in cross-section, a semiconductor device 70 wherein the conductive plug 46 is formed to a doped region 74 formed with the substrate 32, rather than to a metal interconnect. The same processing steps described in reference to FIGS. 4–8 are used to create semiconductor device 70, only the initial structure is different. Rather than forming an interconnect, doped region 74 is formed by conventional ion implantation or diffusion techniques. The interlayer dielectric 40 is deposited over the doped region instead of over an interconnect. Thereafter, processing proceeds in the same manner described above.

Figure 11:
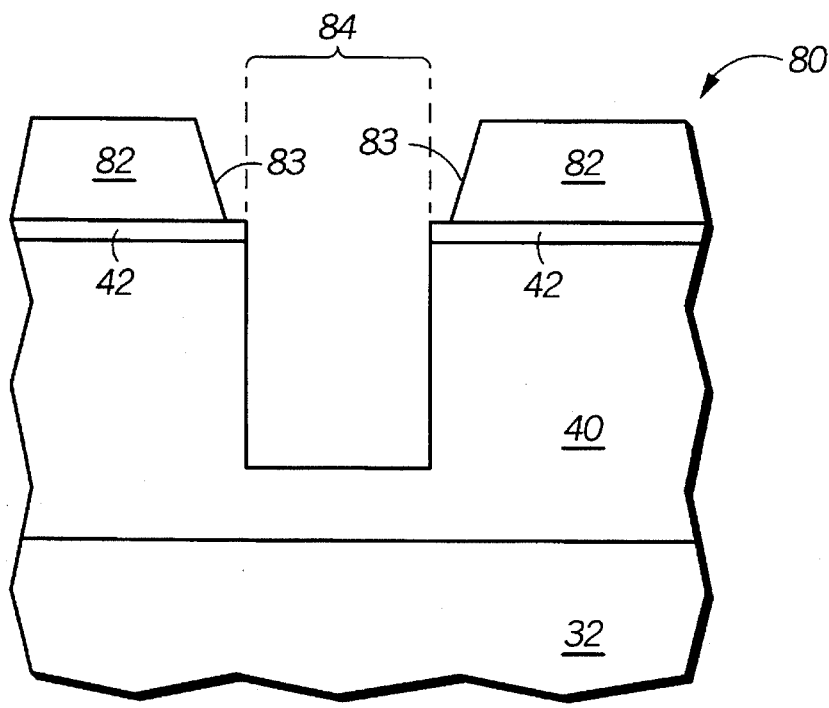
FIG. 11 is another cross-sectional view of a semiconductor device demonstrating a benefit of the present invention relating to critical dimension (CD) control.

Another benefit of using an aluminum nitride layer in accordance with the present invention is that the aluminum nitride can serve as a hard mask for critical dimension (CD) control during via etches. FIG. 11 illustrates, in cross-section, a semiconductor device 80 and the effects of this benefit. In etching vias or openings in dielectric materials, particularly when high aspect ratios (ratios of height to width) are involved, photoresist erosion can adversely affect the dimensions of the opening formed. During prolonged via etches, the photoresist is pulled backed or withdrawn from its originally defined location. Because the photoresist mask edge positions change throughout the course of the etch, the opening created in the interlayer dielectric likewise changes in dimension. Use of an aluminum nitride layer over the dielectric can offset the effects of such photoresist erosion. As shown in FIG. 11, device 80 includes interlayer dielectric 40 overlying substrate 32. An aluminum nitride layer 42 is deposited on the interlayer dielectric, as described above. A photoresist mask 82 is formed on device 80 according to conventional lithography practices. As originally patterned, photoresist mask 82 has an edge 83 which is substantially vertical, and which is aligned to the boundaries of an opening 84 which is to be formed in interlayer dielectric 40. During the course of anisotropically etching interlayer dielectric 40, the edges 83 of photoresist mask 82 erode to the locations illustrated. Without the presence of aluminum nitride layer 42, opening 84 in the interlayer dielectric would have the larger width dimension of the recessed photoresist edges, rather the dimension defined in the original photoresist pattern. However, aluminum nitride has a very low etch rate in fluorine-based chemistries which will likely be used to etch the interlayer dielectric, particularly after the initial stages of the etch. The opening formed in the aluminum nitride layer will maintain its dimensions through the course of even an extended via etch, acting as an etch hard mask. If necessary, the aluminum nitride thickness can be sufficiently increased beyond those thicknesses mentioned above to ensure successful use of the aluminum nitride as a hard mask. It is noted that the CD control benefit of the present invention can be achieved irrespective of the use of the aluminum nitride layer as a glue layer. Moreover, in this aspect of the invention, there need not be an underlying conductive member to which a plug is formed. Moreover, photoresist mask 82 can be removed after forming an opening in aluminum nitride layer 42 but before etching through interlayer dielectric 40. Accordingly, the aluminum nitride mask can be used by itself as an etch mask, thereby eliminating the possibility of photoresist contamination during etch of the interlayer dielectric.

The foregoing description and illustrations contained herein demonstrate many of the advantages associated with the present invention. In particular, it has been revealed that aluminum nitride can be used as a glue layer in the formation of conductive plugs to facilitate a polishing or etch back process. Use of a glue layer in accordance with the present invention has advantages over prior art glue layers in that the time required to form an aluminum nitride glue layer is less than the time required to form prior art layers. In some cases, the aluminum nitride can be deposited in one-tenth (10%) to one-fifth (20%) the time it takes to form conventional titanium and titanium-nitride glue layer combinations. Because a glue layer in accordance with the present invention is deposited on an interlayer dielectric prior to contact opening formation, the glue layer need not be deposited to a thickness sufficient to provide adequate step coverage. Moreover, when used in conjunction with an interconnect capping layer, only one material is needed in the glue layer, whereas prior art glue layers often use a combination of two materials. Yet another advantages is that the present invention is that the glue layer need not be removed, thus saving even more manufacturing time. Furthermore, adverse reactions between prior art glue materials and the underlying metal interconnect are avoided since the glue layer is absent from the contact opening. Rather, the plug material is in direct contact with the metal interconnect, thereby minimizing the potential for increases in contact resistance.

Thus it is apparent that there has been provided, in accordance with the invention, a method for forming a plug and semiconductor device having the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is not necessary that the invention be practiced only in conjunction with the formation of tungsten plugs. Other plug materials, conductive or not, will likely benefit from the teachings herein. In addition, the invention is not limited to forming plugs only to metal layers within a semiconductor device. Rather, the invention can be used in conjunction with forming any plug and at any level within the device, and particularly with forming plugs to diffusion regions of a substrate. Furthermore, if employed in conjunction with a metal interconnect, it is not necessary that a capping portion be used. Nor is it necessary that the aluminum nitride glue layer be deposited or formed in the particular manner described herein. Therefore it is intended that this invention encompass all such variations and modifications as fall within the scope of the appended claims.

We claim:

1. A method for making a semiconductor device, comprising the steps of:

providing a semiconductor substrate having a metal interconnect;

depositing an interlayer dielectric over the metal interconnect;

depositing a glue layer comprised of aluminum nitride on the interlayer dielectric;

etching an opening through both the interlayer dielectric and the glue layer, wherein the opening overlies the metal interconnect and exposes a portion thereof;

depositing a conductive plug material on the glue layer and into the opening sufficiently to fill the opening; and polishing back the conductive plug material to form a conductive plug in the opening and electrically connected to the metal interconnect.

2. The method of claim 1 wherein the step of polishing back comprises polishing back the conductive plug material without removing remaining portions of the glue layer which lie beyond the opening.

3. The method of claim 1 wherein the step of depositing an interlayer dielectric comprises depositing silicon dioxide, and wherein the step of depositing a conductive plug material comprises depositing tungsten.

4. The method of claim 3 wherein the step of providing a semiconductor substrate comprises providing a semiconductor substrate having a metal interconnect, wherein the metal interconnect comprises aluminum.

5. The method of claim 4 wherein the step of providing a semiconductor substrate comprises providing a semiconductor substrate having a metal interconnect, wherein the metal interconnect comprises aluminum and has a conductive capping layer formed on a top surface thereof, and wherein the step of etching comprises etching an opening which exposes a portion of the conductive capping layer of the metal interconnect.

6. The method of claim 1 wherein the step of etching comprises etching an opening which has a sidewall defined by the interlayer dielectric and a bottom defined by the metal interconnect, and wherein the step of depositing a conductive plug material comprises depositing a conductive plug material into the opening and immediately adjacent the sidewall, without an intervening material layer between the conductive plug material and the interlayer dielectric.

7. The method of claim 1 further comprising the step of polishing back remaining portions of the glue layer which lie beyond the opening.

8. A method for making a semiconductor device, comprising the steps of:

providing a semiconductor substrate;

depositing a dielectric over the semiconductor substrate;

depositing a layer comprised of aluminum nitride over the dielectric;

etching a first opening through the layer, the first opening have a first width dimension; and anisotropically etching a second opening into the dielectric using the first opening in the layer as a hard mask, such that the second opening has a second width dimension substantially equal to the first width dimension.

9. The method of claim 8 further comprising the steps of:

patterning a photoresist mask on the layer comprised of aluminum nitride, the photoresist mask defining a boundary of the first opening;

using the photoresist mask to create the first opening; and removing the photoresist mask prior to anisotropically etching the second opening.

10. The method of claim 8 wherein the step of providing a semiconductor substrate comprises providing a semiconductor substrate having a conductive region to be contacted, wherein the step of anisotropically etching comprises anisotropically etching a second opening which exposes the conductive region, and further comprising the steps of:

depositing a conductive plug material onto remaining portions of the layer and into the second opening, sufficiently to fill the second opening and make electrical contact to the conductive region, wherein the conductive plug material within the second opening is immediately adjacent the dielectric; and removing portions of the conductive plug material existing beyond the second opening to form a conductive plug.

11. A method for making a semiconductor device, comprising the steps of:

providing a semiconductor substrate having a conductive region to be contacted;

depositing a dielectric over the conductive region;

depositing an glue layer comprised of aluminum nitride over the dielectric;

etching an opening through the glue layer, into the dielectric, and exposing the conductive region;

depositing a conductive plug material onto remaining portions of the glue layer and into the opening, sufficiently to fill the opening and make electrical contact to the conductive region, wherein the conductive plug material within the opening is immediately adjacent the dielectric; and removing portions of the conductive plug material existing beyond the opening to form a conductive plug.

12. The method of claim 11 further comprising the step of removing portions of the glue layer existing beyond the opening.

13. The method of claim 12 wherein the steps of removing portions of the conductive plug material and removing portions of the glue layer are performing by polishing.

14. The method of claim 11 wherein the step of removing portions of the conductive plug material comprises removing the conductive plug material using the glue layer as a removal stopping material.

15. The method of claim 14 further comprising the step of depositing a material over the conductive plug and dielectric layer without removing remaining portions of the glue layer.

16. The method of claim 11 wherein the step of etching an opening comprises etching an opening through the glue layer and into the dielectric using a substantially same dry etch chemistry.

17. The method of claim 11 wherein the step of providing a semiconductor substrate comprises providing a semiconductor substrate having an aluminum interconnect as the conductive region.

18. The method of claim 17 wherein the step of providing a semiconductor substrate comprises providing a semiconductor substrate having an aluminum interconnect as the conductive region, and wherein the aluminum interconnect has an overlying tungsten capping layer.

19. The method of claim 11 wherein the step of providing a semiconductor substrate comprises providing a semiconductor substrate having a doped substrate region as the conductive region.

20. A method of making a semiconductor device, comprising the steps of:

providing a semiconductor substrate;

forming a metal interconnect over the semiconductor substrate, wherein the metal interconnect has a primary portion comprised of aluminum and has an overlying capping layer;

depositing an interlayer dielectric over the metal interconnect;

depositing a glue layer comprised of aluminum nitride on the interlayer dielectric;

etching an opening through the glue layer and into the interlayer dielectric to expose a portion of the capping layer of the metal interconnect;

depositing a plug layer comprised of tungsten over the semiconductor substrate and on the glue layer until adequately filling the opening and making electrical contact to the metal interconnect; and polishing back the plug layer to remove portions of the plug layer beyond the opening, thereby forming a tungsten plug in the opening.

21. The method of claim 20 wherein the step of forming a metal interconnect comprises forming a metal interconnect having a capping layer comprised of tungsten.

22. The method of claim 21 wherein the step of forming a metal interconnect comprises forming a metal interconnect having a capping layer, and wherein the capping layer further comprises titanium nitride.

23. The method of claim 20 further comprising the step of removing remaining portions of the glue layer existing beyond the opening.

24. The method of claim 23 wherein the step of removing remaining portions of the glue layer is done as part of the step of polishing back the plug layer.

25. The method of claim 20 further comprising the step of depositing a conductive layer over the tungsten plug and remaining portions of the glue layer.

* * * * *